(12) United States Patent
Mirabella et al.

(10) Patent No.: US 11,886,779 B2
(45) Date of Patent: Jan. 30, 2024

(54) ACCELERATED SIMULATION SETUP PROCESS USING PRIOR KNOWLEDGE EXTRACTION FOR PROBLEM MATCHING

(71) Applicant: Siemens Industry Software NV, Leuven (BE)

(72) Inventors: Lucia Mirabella, Plainsboro, NJ (US); Sanjeev Srivastava, Princeton Junction, NJ (US); Livio Dalloro, Plainsboro, NJ (US)

(73) Assignee: Siemens Industry Software NV, Leuven (BE)

( * ) Notice: Subject to any disclaimer, the term of this patent is extended or adjusted under 35 U.S.C. 154(b) by 0 days.

(21) Appl. No.: 16/766,816

(22) PCT Filed: Nov. 27, 2018

(86) PCT No.: PCT/US2018/062565
§ 371 (c)(1),
(2) Date: May 26, 2020

(87) PCT Pub. No.: WO2019/104304
PCT Pub. Date: May 31, 2019

(65) Prior Publication Data
US 2021/0019456 A1 Jan. 21, 2021

Related U.S. Application Data

(60) Provisional application No. 62/590,675, filed on Nov. 27, 2017.

(51) Int. Cl.
*G06F 30/20* (2020.01)
*G06N 5/022* (2023.01)
*G06N 5/04* (2023.01)

(52) U.S. Cl.
CPC ............ *G06F 30/20* (2020.01); *G06N 5/022* (2013.01); *G06N 5/04* (2013.01)

(58) Field of Classification Search
CPC .......... G06F 30/20; G06N 5/022; G06N 5/04
(Continued)

(56) References Cited

U.S. PATENT DOCUMENTS 9,177,225 B1 * 11/2015 Cordova-Diba ... G06K 9/00671
10,305,758 B1 * 5/2019 Bhide ................. G06F 16/2477
(Continued)

OTHER PUBLICATIONS

Lee et al. (Design and Implementation of a Data-Driven Simulation Service System, 4 pages (Year: 2016).*
(Continued)

*Primary Examiner* — Andre Pierre Louis

(57) ABSTRACT

A system and method for accelerated simulation setup includes receiving a description of a new problem for simulation, extracting input data and output data of previous simulation results, generating a representation of data based on the extracted input data and output data, and quantifying similarities between the new problem and the extracted input data and output data to identify a candidate simulation for the new problem. A machine learning component infers a solution output for the new problem based on extrapolation or interpolation of outputs of the candidate simulation, thereby conserving resources by eliminating a simulation generation and execution. Alternatively, an efficient simulation setup can be generated using the queried knowledge, input variables, and input parameters corresponding to the candidate simulation.

8 Claims, 3 Drawing Sheets

(58) Field of Classification Search
USPC .............................................................. 703/2
See application file for complete search history.

(56) References Cited

U.S. PATENT DOCUMENTS

| | | |
|---|---|---|
| 10,558,780 B1 * | 2/2020 | Kukal ..................... G06F 30/33 |
| 2013/0124176 A1 | 5/2013 | Fox et al. |
| 2015/0057982 A1 | 2/2015 | Coffey |
| 2015/0331402 A1 | 11/2015 | Lin et al. |
| 2017/0154108 A1 * | 6/2017 | Kraus ................. G06F 16/3346 |
| 2018/0018590 A1 * | 1/2018 | Szeto ..................... G16H 50/20 |

OTHER PUBLICATIONS

International Search Report dated Feb. 13, 2019; International Application No. PCT/US2018/062565; 15 pages.
Ki Lee et al.: "Design and implementation of a data-driven simulation service system" Emerging Databases, Oct. 17, 2016 (Oct. 17, 2016), pp. 77-80, XP055551852 / 17.10.2016.

* cited by examiner

ACCELERATED SIMULATION SETUP PROCESS USING PRIOR KNOWLEDGE EXTRACTION FOR PROBLEM MATCHING

TECHNICAL FIELD

This application relates to digital simulation and modeling useful during stages of a product life cycle. More particularly, this application relates to accelerated simulation setup processes.

BACKGROUND

One current trend in design of 3D objects or of discrete systems is to feed and utilize information gathered from later stages of the product life cycle, such as manufacturing phase, operation phase or end-of-life stage, to generate higher quality designs at the design stage. While pursuing such vision is desirable, bottlenecks exist at the actual implementation level due to the difficulty in acquiring data and due to the data being only available for particular problem/solution scenarios that played out. Data collection is not always widespread and integrated with the process, requiring assumptions for missing data and manual effort for the integration. As such, the design reasoning misses information pertaining to other possible situations, perhaps some of which is essential and/or rarely occurring. In addition, the timeline between design and actual production, operation and end of life can stretch through years, making the inference from collected data obsolete. For the above reasons, the use of digital simulation is having an increasingly important role in this area. Simulations are being used to overcome the lack of data, to shrink the time frame between design phase and end of life-cycle phase and to test potential but unlikely scenarios. However, simulations can be highly dependent on manual input in deciding the modeling assumptions and the simulation setup, which often prolongs the simulation setup process and can result in a multiplicity of trial and error simulation runs that are severely time inefficient. Simulations require high computational time, need for manual input, development of problem formulation in complex scenarios, and accurate parameter estimation.

A problem to be solved for simulation setup includes determining inputs for each simulation case in terms of one or more of the following: solver type and level of complexity (e.g. 1D vs 3D), type of coupling between physics (if more than one), mesh refinement, boundary conditions (e.g., type and values), time discretization, or the like. Inefficiencies and wasted resources can be minimized by optimizing the selection of inputs for the simulation setup through artificial intelligence.

SUMMARY

A system and method for accelerated simulation setup includes receiving a description of a new problem for simulation, extracting input data and output data of previous simulation results, generating a representation of data based on the extracted input data and output data, and quantifying similarities between the new problem and the extracted input data and output data to identify a candidate simulation for the new problem. A machine learning component infers a solution output for the new problem based on extrapolation or interpolation of outputs of the candidate simulation, thereby conserving resources by eliminating a simulation generation and execution. Alternatively, an efficient simulation setup can be generated using the queried knowledge, input variables, and input parameters corresponding to the candidate simulation.

BRIEF DESCRIPTION OF THE DRAWINGS

Non-limiting and non-exhaustive embodiments of the present embodiments are described with reference to the following FIGURES, wherein like reference numerals refer to like elements throughout the drawings unless otherwise specified.

DETAILED DESCRIPTION

Methods and systems are disclosed for accelerating setup for model simulation and determining an estimated accuracy of the simulation for a new problem to be solved. Examples of model simulations may include a 3D model of an industrial component or system of components, such as fluid flow through a pipe, or physical stresses on a transportation chassis to name a few of many possibilities. The simulation models may be quite complex, consisting of multidimensional independent and dependent variables, such that simulation setup under conventional means would require a burdensome time investment. The disclosed system may receive a description of a new problem and can extract knowledge learned from existing simulation models, or from the recorded setup process of existing simulation models, used to solve previous problems that may not even be overtly related to the new problem. Additional sources for prior knowledge may include a library of documents (e.g., scientific literature) which may be scrubbed by the disclosed system to extract relevant information. The system may quantify similarities (e.g., hidden similarities) between the new problem and the solved problems to find a match with an existing simulation model, and determine input parameters for the simulation setup. The selected simulation may be executed using the determined setup parameters and can quickly provide a solution to the new problem without having to expend resources into generating a new simulation model from scratch. The results of the simulation execution may be analyzed to determine if the simulation provides an acceptable tolerance for accuracy. The selected simulation model may be tailored by a user making adjustments to input parameters as guided by recommendations from the system.

In an embodiment, the operation of learning from prior knowledge of simulation experience should be performed using artificial intelligence (AI) approaches to the maximum extent possible. For example, the system may rely on AI for a significant portion of the solution, and where gaps are detected, a query may be generated to request a user (e.g., engineering personnel) for additional information or a selection decision that cannot be inferred from past knowledge with an acceptable confidence level. The embodiments of this disclosure provide technical solutions for the following problems:

1) how to extract and apply knowledge from written documents of best practices and/or successful stories;
2) how to use past simulation results to learn proper simulation configurations for new problems; and
3) how to use data related to operations or sub-operations performed by a user (e.g., a computer-aided engineering (CAE) engineer) in setting up a prior simulation to learn the operations to perform for setting up a new simulation (e.g., what steps and checks lead to a change in the setup).

Figure 1:
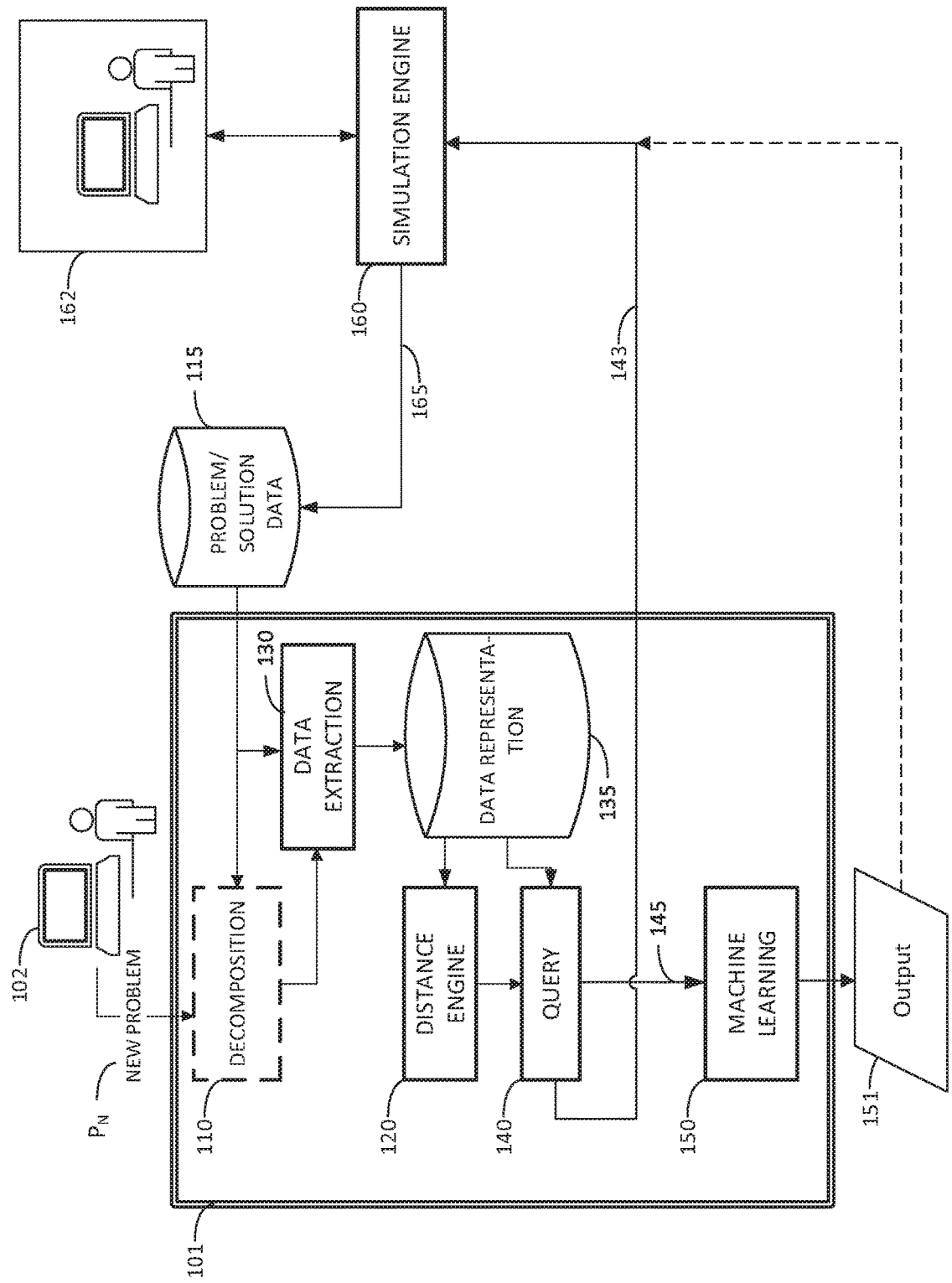
FIG. 1 is a block diagram for an example of a system for accelerated simulation setup in accordance with embodiments of the disclosure.

FIG. 1 is a block diagram for an example of a system for simulation setup and execution in accordance with embodiments of the disclosure. System 100 as shown includes a simulation engine 160 and a simulation setup accelerator 101 that may include a decomposition unit 110, a distance engine 120, a data extraction unit 130, a query engine 140, and a machine learning component 150. Given a new problem $P_N$ that needs to be solved, the simulation setup accelerator 101 may automatically derive the settings needed to perform a simulation analysis by the simulation engine 150. For example, the simulation setup accelerator 101 may generate a list of settings for a simulation model, such as a boundary variable and a boundary value to prescribe on each element of the boundary, a mesh definition, a time step parameter, a time advancing scheme label, or a combination thereof.

The simulation setup accelerator 101 may receive a description of the new problem $P_N$ for simulation setup as entered by a user 102, using a workstation or graphical user interface (GUI) for example. The decomposition unit 110 may be provided as an optional feature to receive the description of a new problem $P_N$ for simulation, and may decompose the problem into several sub-problems to simplify comparison to previous simulation data for finding a candidate simulation. For example, problem $P_N$ may consist of several elements or components for simulation, which may be divided according to a particular category or classification. If optional decomposition unit 110 is not utilized, the data extraction unit 130 may directly extract information for the new problem $P_N$ to be simulated and the problem solution data 115 to quantify similarities.

The data extraction unit 130 may be configured to extract knowledge from problem/solution data 115, including numerical data and text. For each data in numeric form, data may be summarized in a concise and machine processable form. For each data in natural language form, data may be extracted in machine processable form (e.g., fields with numeric or Boolean values attached, logic propositions). For this process, existing library of natural language processing (NLP) can be used, possibly with additional development. Problem/solution data 115 may include a set of input/output (I/O) data generated, accumulated, and stored by previously solved problem simulations $P_1 \ldots P_{N-1}$, for which solutions were derived by means of analysis of simulation modeling. Such data can be in multiple forms including values of pointwise fields over a 3D geometry (potentially in time), vector of simulation settings, text, or the like. For example, some problem simulations $P_1 \ldots P_{N-1}$ could be of the same object of interest as new problem $P_N$, but having a different geometry with conceptually the same boundary conditions, different mesh and time discretization parameters. As a particular example, new problem $P_N$ may relate to flow rate and pressure simulation through a vertical round pipe structure of diameter $D_N$ with mesh cell shape $M_N$ and time discretization $T_N$. Among many previous simulations (e.g., between about 100 and about 1000 problem simulations), problem/solution data 115 may be searched to find a candidate problem simulation $P_1$ having stored simulation parameters for a flowrate and pressure simulation of a horizontal piping structure (i.e., different geometry) with similar diameter $D_1$ and different mesh cell shape $M_1$ and time discretization $T_1$. Advantages of the simulation setup accelerator 101 include the capability the distance engine 120 to autonomously identify a strong candidate problem simulation from among the many candidates, and to quantify the similarities of parameters between the candidate simulation and the new problem to be simulated. Among the variables in the problem/solution data collection 115 for problem simulations $P_1 \ldots P_{N-1}$, the simulation setup accelerator 101 may determine a subset to be considered as input for problem simulation $P_N$ and which subset is to be the output variables set. For example, geometrical definition and conceptual boundary conditions may be determined to be the input variables for the new problem simulation, while mesh definition, time discretization parameter and time advancing scheme may be determined to be the output variables for the new problem simulation.

Data corresponding to new problem $P_N$ may be extracted by the data extraction unit 130 and stored as data representation 135 in a way similar to that described herein for data 115.

The data extraction unit 130 may store the data in an efficient manner. In an embodiment, the data may be organized as a knowledge graph database or an ontology for a data representation 135. The structure of the knowledge representation may include ranking information or a distance field to allow fast recognition of related simulations which may be clustered according to similarity for common characteristics. The advantage of the autonomous ranking feature is that attempts to manually locate candidate problem simulations would be based on common characteristics without a deeper understanding of hidden similarities for an accurate quantification.

In an embodiment, the data extraction unit 130 may store the data according to a recommendation system for classifying the data in the data representation 135. For example, the data may be classified in a format compatible with a series of questions and answers communicated between a user and the simulation setup accelerator 101.

The data extraction unit 130 may be configured to read textual data (e.g., a published scientific paper), identify a use case along with settings used for the simulation, determine which settings did or did not successfully simulate the problem, and extract a rule for the data representation according to exclusion of failure settings and inclusion of successful settings. For example, the data extraction unit 130 may extract a simulation in which a mesh size setting of 0.5 was applied, but the simulation was unsuccessful. As a result of this knowledge, a rule may be inserted into the data representation for this previous problem simulation that mesh size should not equal 0.5, or that mesh size 0.5 is a failure setting to be excluded.

The distance engine 120 may analyze the data of new problem $P_N$ and problem solution data 115 as received from data representation 135, such as vector representations, and similarities may be derived according to calculated distance between the vectors. The distance engine 120 may also quantify similarities between problem $P_N$ and a problem Pi based on evaluation of weighted edges between nodes to determine relative distances between ontological features of the problems $P_N$ and Pi.

Using information of the quantified similarities determined by the distance engine 120, the query engine 140 may formulate a query of the data representation 135 corresponding to the candidate simulation problem Pi determined to have similar traits. On a condition that the query determines a weak match (e.g., based on a similarity score corresponding to a value below an established threshold, such as 70%), the extracted data 135 can be used as input 143 for simulation setup at simulation engine 160 by identifying knowledge gaps to the user 162. As a result, manual efforts for determination of simulation input parameters and variables are reduced as condensed to the remaining knowledge gaps, while primarily relying on the information gleaned from the previous simulations. Input 143 may be particularly advantageous where knowledge includes rules for parameters and variables that were or were not successful in previous simulations. Alternatively, on a condition that the prediction of simulation setup requires high certainty (e.g., this may be a prerequisite parameter specified in input information for new problem $P_N$), queried parameters may be sent as input 145 to machine learning component 150 to infer simulation setup parameters for a new simulation. In such case, output 151 is sent as simulation setup parameters to simulation engine 160. On a condition that the query engine 140 identifies a similarity score corresponding to a strong match according to an established threshold (e.g., 70% similarity), a simulation can be skipped to conserve time, and the parameters and variables 145 of data representation 135 for the candidate simulation may be sent to the machine learning component 150 for obtaining the solution at output 151 for new problem $P_N$.

The machine learning component 150 may predict output 151 as the solution for new problem $P_N$ using inferences based on extrapolation or interpolation of output values of previously solved problem Pi toward a value expected of the input values for problem $P_N$. For example, when query engine 140 determines that there is a strong confidence level for relying on a previous simulation based on the similarity score, an actual simulation is bypassed, yielding significant conservation of resources. Alternatively, the machine learning component 150 may predict the parameters of the simulation setup without predicting the simulation results, where output 151 is sent to the simulation engine 160. For example, when the query engine 140 determines a weak confidence level for relying on the prediction of the simulation result based on prior data, output 151 is presented as simulation setup parameters.

The simulation engine 160 may execute the candidate simulation using the simulation setup inputs 143. Alternatively, the simulation engine 160 may receive simulation setup inputs from the output 151 as described above. Simulation results 165 for new problem $P_N$ may be stored in problem/solution data 115 as the next accumulated data to be accessible for simulation setup for problem $P_{N+1}$ and beyond. Simulation results may also be presented, such as a rendering for display to user 162.

Figure 2:
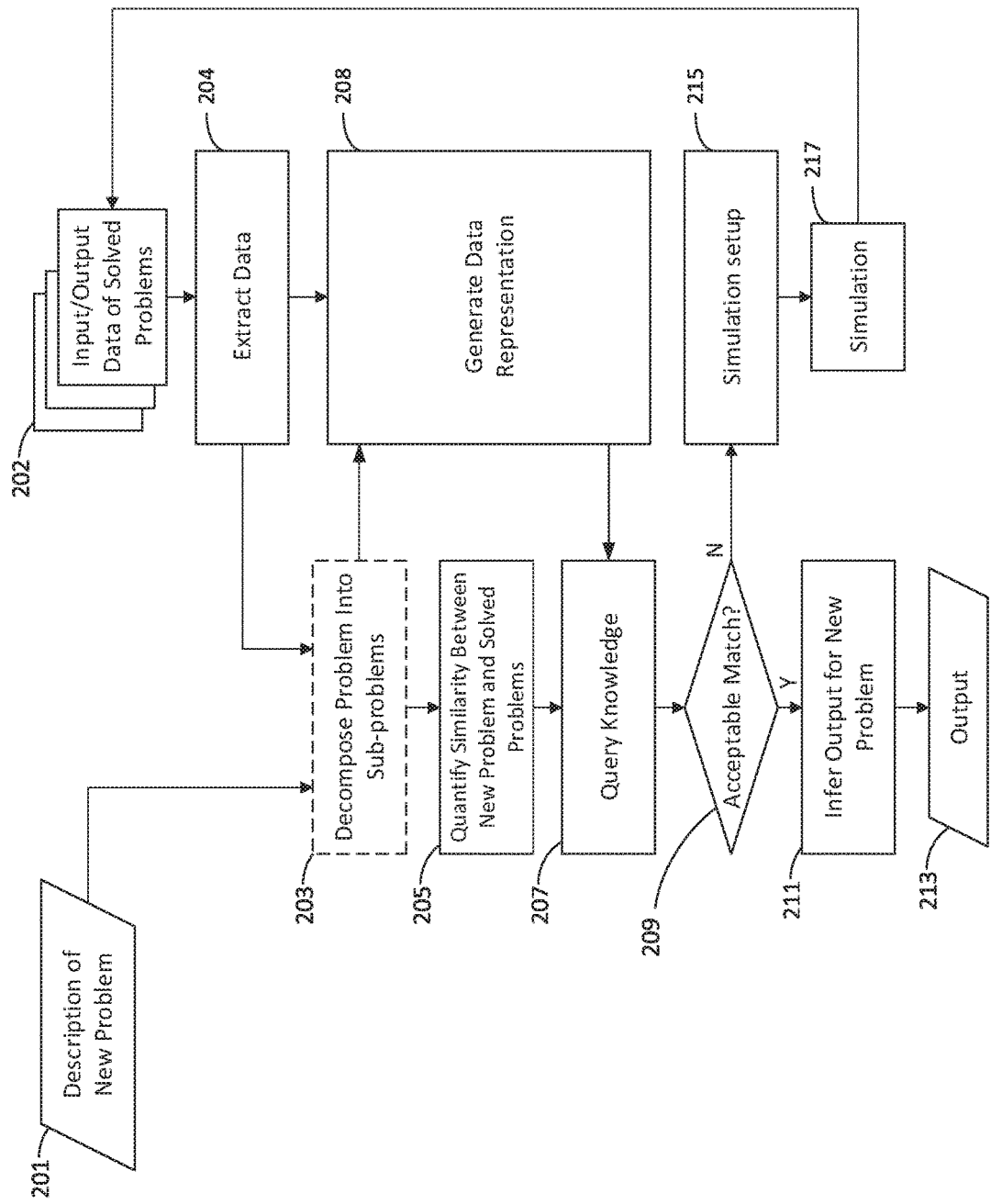
FIG. 2 is a flow diagram for an example of a method for accelerated simulation setup in accordance with embodiments of the disclosure.

FIG. 2 is a flow diagram for an example of a method for simulation setup and execution in accordance with embodiments of the disclosure. At 201, the simulation setup accelerator 101 may receive a description of a new problem $P_i$ to be solved. For example, the problem description may define parameters and input/output variables.

At 204, data may be extracted from input/output data of simulations of previously solved problems 202.

At optional step 203, the new problem $P_N$ and previously simulated problems $P_i$ from extracted data 204 may be decomposed into subcomponents (e.g., $P_i$ decomposed into subcomponents $P_{i1}$ ... $P_{iK}$, for $K \neq N$). For example, the problem $P_i$ could be a recursive partitioning method that creates a decision tree with a given number of 2-way partitions, a given number of 3-way partitions and so on, until some stopping criteria are satisfied. In an embodiment, the stopping criteria may be based on the computation of a distance metric, as will be further described below.

At 205, similarity can be quantified between the current problem (or its sub-problems) and prior problems (or sub-problems). A method can be applied to compute a metric that represents the distance (opposite of similarity) between problems, based on certain feature sets. For a 3D simulation problem, in addition to the numeric variables mentioned above, the 3D geometry may also be analyzed automatically to identify features. Depending on the problem, the relevant ones might be on the characteristic sizes, on the curvature of surfaces, on the tortuosity of the domain, or some other similar criterion. One approach could be to consider all the possible (relevant) geometric features and feed them to the method steps referenced below. In addition, a metric of similarity between two problems needs to be defined, e.g., considering the normalized norm of the difference between features vectors.

At 208, a data representation may be generated that is designed to facilitate and speed up the identification in a large dataset of problems with features similar to a given features set. In an embodiment, each solved problem (or sub problem) may be represented as a node in a graph using weighted edges to represent distances between them. This can speed up the identification of past similar problem and solution sets, which can then be used in the computation of solution for a new problem. Each problem (or sub-problem) node may have child nodes representing the corresponding data extracted at 204. In an embodiment, means for inserting elements (such as nodes) in the data representation may include an ontological algorithm, based either on a predefined ontology or on an ontology automatically generated using artificial intelligence based on available data. In an embodiment, means for a user to efficiently browse the data representation may include a graphical user interface (GUI).

At 207, a query for knowledge drawn from the data representation may elicit parameters and variables needed to simulate the new problem $P_N$. For example, parameters and variables from previous simulations may be evaluated to determine which of those provide accurate results (i.e., a successful simulation) and which of those resulted in poor results (i.e., an unsuccessful simulation). A source of information useful for this assessment may include textual information, such as commentary recorded by personnel who conducted the previous simulations, extracted by artificial intelligence. The query may generate a similarity score to quantify whether the simulation for candidate problem Pi includes information suitably matched for an accurate solution to new problem $P_N$, i.e., whether candidate problem Pi is an acceptable match.

At 209, the similarity score from the query may be measured against a threshold for an acceptable match (e.g., a similarity score of 70% or greater). If the similarity score indicates that the candidate simulation is an acceptable match, then the an inference algorithm may be executed at 211 to infer the solution outputs for the new problem $P_N$ based on collected input and output data of similar problem simulation data, without having to run a new simulation. On the other hand, if there is not an acceptable matching candidate simulation at 209, then a simulation setup 215 can commence with the benefit of the extracted knowledge of previous simulations. The simulation 217 results generated in this case can then be used as prior data 202 for successive utilization of the system.

Advantages of the accelerated simulation setup include improved performance through elimination of manual steps.

Exploration of design space may be improved due to the possibility of exploring a larger space at limited cost. Simulation setup is also more efficient by utilization of AI to identify relevant knowledge from previous simulations and lessons learned from human expertise extracted from scientific literature.

Figure 3:
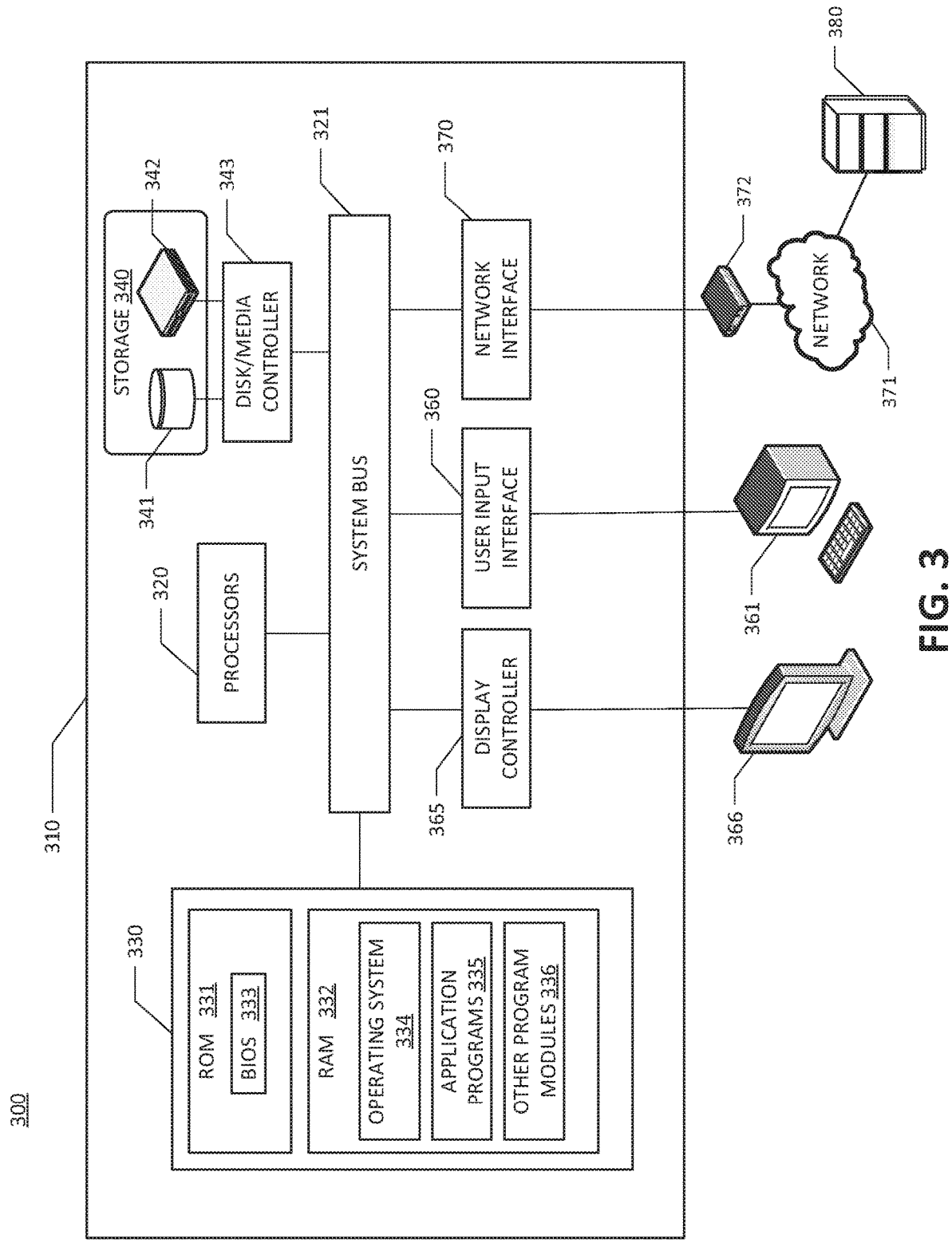
FIG. 3 shows an exemplary computing environment within which embodiments of the disclosure may be implemented.

FIG. 3 shows an exemplary computing environment within which embodiments of the disclosure may be implemented. As shown in FIG. 3, the computer system 310 may include a communication mechanism such as a system bus 321 or other communication mechanism for communicating information within the computer system 310. The computer system 310 further includes one or more processors 320 coupled with the system bus 321 for processing the information.

The processors 320 may include one or more central processing units (CPUs), graphical processing units (GPUs), or any other processor known in the art. More generally, a processor as described herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 320 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor may be capable of supporting any of a variety of instruction sets. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

The system bus 321 may include at least one of a system bus, a memory bus, an address bus, or a message bus, and may permit exchange of information (e.g., data (including computer-executable code), signaling, etc.) between various components of the computer system 310. The system bus 321 may include, without limitation, a memory bus or a memory controller, a peripheral bus, an accelerated graphics port, and so forth. The system bus 321 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnects (PCI) architecture, a PCI-Express architecture, a Personal Computer Memory Card International Association (PCMCIA) architecture, a Universal Serial Bus (USB) architecture, and so forth.

Continuing with reference to FIG. 3, the computer system 310 may also include a system memory 330 coupled to the system bus 321 for storing information and instructions to be executed by processors 320. The system memory 330 may include computer readable storage media in the form of volatile and/or nonvolatile memory, such as read only memory (ROM) 331 and/or random access memory (RAM) 332. The RAM 332 may include other dynamic storage device(s) (e.g., dynamic RAM, static RAM, and synchronous DRAM). The ROM 331 may include other static storage device(s) (e.g., programmable ROM, erasable PROM, and electrically erasable PROM). In addition, the system memory 330 may be used for storing temporary variables or other intermediate information during the execution of instructions by the processors 320. A basic input/output system 333 (BIOS) containing the basic routines that help to transfer information between elements within computer system 310, such as during start-up, may be stored in the ROM 331. RAM 332 may contain data and/or program modules that are immediately accessible to and/or presently being operated on by the processors 320. System memory 330 may additionally include, for example, operating system 334, application programs 335, and other program modules 336.

The operating system 334 may be loaded into the memory 330 and may provide an interface between other application software executing on the computer system 310 and hardware resources of the computer system 310. More specifically, the operating system 334 may include a set of computer-executable instructions for managing hardware resources of the computer system 310 and for providing common services to other application programs (e.g., managing memory allocation among various application programs). In certain example embodiments, the operating system 334 may control execution of one or more of the program modules depicted as being stored in the data storage 340. The operating system 334 may include any operating system now known or which may be developed in the future including, but not limited to, any server operating system, any mainframe operating system, or any other proprietary or non-proprietary operating system.

The application programs 335 may a set of computer-executable instructions for performing the operative processes in accordance with embodiments of the disclosure.

The computer system 310 may also include a disk/media controller 343 coupled to the system bus 321 to control one or more storage devices for storing information and instructions, such as a magnetic hard disk 341 and/or a removable media drive 342 (e.g., floppy disk drive, compact disc drive, tape drive, flash drive, and/or solid state drive). Storage devices 340 may be added to the computer system 310 using an appropriate device interface (e.g., a small computer system interface (SCSI), integrated device electronics (IDE), Universal Serial Bus (USB), or FireWire). Storage devices 341, 342 may be external to the computer system 310, and may be used to store data in accordance with the embodiments of the disclosure.

The computer system 310 may also include a display controller 365 coupled to the system bus 321 to control a display or monitor 366, such as a cathode ray tube (CRT) or liquid crystal display (LCD), for displaying information to a computer user. The computer system includes a user input interface 360 and one or more input devices, such as a user terminal 361, which may include a keyboard, touchscreen, tablet and/or a pointing device, for interacting with a computer user and providing information to the processors 320. The display 366 may provide a touch screen interface which allows input to supplement or replace the communication of direction information and command selections by the user terminal device 361.

The computer system 310 may perform a portion or all of the processing steps of embodiments of the invention in response to the processors 320 executing one or more sequences of one or more instructions contained in a memory, such as the system memory 330. Such instructions may be read into the system memory 330 from another computer readable medium, such as the magnetic hard disk 341 or the removable media drive 342. The magnetic hard disk 341 may contain one or more data stores and data files used by embodiments of the present invention. The data store may include, but are not limited to, databases (e.g., relational, object-oriented, etc.), file systems, flat files, distributed data stores in which data is stored on more than one node of a computer network, peer-to-peer network data stores, or the like. The processors 320 may also be employed in a multi-processing arrangement to execute the one or more sequences of instructions contained in system memory 330. In alternative embodiments, hard-wired circuitry may be used in place of or in combination with software instructions. Thus, embodiments are not limited to any specific combination of hardware circuitry and software.

As stated above, the computer system 310 may include at least one computer readable medium or memory for holding instructions programmed according to embodiments of the invention and for containing data structures, tables, records, or other data described herein. The term "computer readable medium" as used herein refers to any medium that participates in providing instructions to the processors 320 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as magnetic hard disk 341 or removable media drive 342. Non-limiting examples of volatile media include dynamic memory, such as system memory 330. Non-limiting examples of transmission media include coaxial cables, copper wire, and fiber optics, including the wires that make up the system bus 321. Transmission media may also take the form of acoustic or light waves, such as those generated during radio wave and infrared data communications.

Computer readable medium instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, may be implemented by computer readable medium instructions.

The computing environment 300 may further include the computer system 310 operating in a networked environment using logical connections to one or more remote computers, such as remote computing device 380. The network interface 370 may enable communication, for example, with other remote devices 380 or systems and/or the storage devices 341, 342 via the network 371. Remote computing device 380 may be a personal computer (laptop or desktop), a mobile device, a server, a router, a network PC, a peer device or other common network node, and typically includes many or all of the elements described above relative to computer system 310. When used in a networking environment, computer system 310 may include modem 372 for establishing communications over a network 371, such as the Internet. Modem 372 may be connected to system bus 321 via user network interface 370, or via another appropriate mechanism.

Network 371 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 310 and other computers (e.g., remote computing device 380). The network 371 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 371.

It should be appreciated that the program modules, applications, computer-executable instructions, code, or the like depicted in FIG. 3 as being stored in the system memory 330 are merely illustrative and not exhaustive and that processing described as being supported by any particular module may alternatively be distributed across multiple modules or performed by a different module. In addition, various program module(s), script(s), plug-in(s), Application Programming Interface(s) (API(s)), or any other suitable computer-executable code hosted locally on the computer system 310, the remote device 380, and/or hosted on other computing device(s) accessible via one or more of the network(s) 371, may be provided to support functionality provided by the program modules, applications, or computer-executable code depicted in FIG. 3 and/or additional or alternate functionality. Further, functionality may be modularized differently such that processing described as being supported collectively by the collection of program modules depicted in FIG. 3 may be performed by a fewer or greater number of modules, or functionality described as being supported by any particular module may be supported, at least in part, by another module. In addition, program modules that support the functionality described herein may form part of one or more applications executable across any number of systems or devices in accordance with any suitable computing model such as, for example, a client-server model, a peer-to-peer model, and so forth. In addition, any of the functionality described as being supported by any of the program modules depicted in FIG. 3 may be implemented, at least partially, in hardware and/or firmware across any number of devices.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112(f), unless the element is expressly recited using the phrase "means for."

What is claimed is:

1. A system for accelerated simulation setup for simulating a 3D model of an industrial component, comprising:
   a processor; and
   a memory having stored thereon instructions executable by the processor, the instructions comprising:
   a simulation setup accelerator, comprising:
      a data extraction unit configured to:
         receive a description of a new problem for simulating the 3D model of an industrial component;
         extract input data and output data of previous simulations including simulations of solutions to problems not overtly related to the new problem;
         extract textual information from commentary recorded by personnel who conducted one or more of the previous simulations, the textual information relating to assessment of variables and parameters used in the previous simulations;
      generate a first data representation of simulation parameters corresponding to the new problem;
      generate a plurality of second data representations, each second data representation corresponding to one of the previous simulations based on the extracted input data and output data using an ontological algorithm to represent each solved problem of previous simulations as a node in a graph and weighted edges represent distances between each node, wherein the second data representations are stored efficiently by an autonomous ranking feature;
   a distance engine configured to:
      quantify similarities, including hidden similarities, between the new problem and the extracted input data and output data based on clustering distances between the first and second data representations and based on the extracted textual information;
   a query engine configured to:
      formulate a query of the second data representations corresponding to the quantified similarities to determine a candidate problem simulation based on a similarity score; and
   a machine learning component configured to:
      infer solution outputs for the new problem based on extrapolation or interpolation of outputs of the candidate problem simulation, on a condition that the similarity score is equal to or greater than a threshold for an acceptable match; and
   a simulation engine configured to execute the candidate problem simulation for the 3D model on a condition that the similarity score is less than the threshold for an acceptable match, wherein the candidate problem simulation is generated using the query, input variables, and input parameters corresponding to the candidate problem simulation.

2. The system of claim 1, wherein the simulation setup accelerator is further configured to decompose the new and prior problems into sub-problems.

3. The system of claim 1, wherein the data extraction includes determining simulation failure settings that did not successfully simulate a previously solved problem, and the simulation setup accelerator is further configured to generate a rule for the data representation that excludes the failure settings.

4. The system of claim 1, wherein the graph includes child nodes representing extracted data corresponding to the node representing a respective solved problem, and the similarity score generated by the query is based on analysis of nodes and child nodes of the graph.

5. A computer-implemented method for accelerated simulation setup for simulating a 3D model of an industrial component, comprising:
   receiving a description of a new problem for simulating the 3D model of an industrial component;
   extracting input data and output data of previous simulations including simulations of solutions to problems not overtly related to the new problem;
   extracting textual information from commentary recorded by personnel who conducted one or more of the previous simulations, the textual information relating to assessment of variables and parameters used in the previous simulations;

generating a first data representation of simulation parameters corresponding to the new problem;

generating a plurality of second data representations, each second data representation corresponding to one of the previous simulations based on the extracted input data and output data using an ontological algorithm to represent each solved problem of previous simulations as a node in a graph and weighted edges represent distances between each node, wherein the second data representations are stored efficiently by an autonomous ranking feature;

quantifying similarities, including hidden similarities, between the new problem and the extracted input data and output data based on clustering distances between the first and second data representations and based on the extracted textual information;

formulating a query of the second data representations corresponding to the quantified similarities to determine a candidate problem simulation based on a similarity score;

on a condition that the similarity score is equal to or greater than a threshold for an acceptable match:

inferring, by a machine learning component, solution outputs for the new problem based on extrapolation or interpolation of outputs of the candidate problem simulation; and execute the candidate problem simulation for the 3D model on a condition that the similarity score is less than the threshold for an acceptable match, wherein the candidate problem simulation is generated using the query, input variables, and input parameters corresponding to the candidate problem simulation.

6. The method of claim 5, further comprising decomposing the new and prior problems into sub-problems.

7. The method of claim 5, wherein the data extraction includes determining simulation failure settings that did not successfully simulate a previously solved problem, the method further comprising generating a rule for the data representation that excludes the failure settings.

8. The method of claim 5, wherein the graph includes child nodes representing extracted data corresponding to the node representing a respective solved problem, and the similarity score generated by the query is based on analysis of nodes and child nodes of the graph.

* * * * *